United States Patent
Glassman et al.

(10) Patent No.: US 11,430,948 B2
(45) Date of Patent: Aug. 30, 2022

(54) RESISTIVE RANDOM ACCESS MEMORY DEVICE WITH SWITCHING MULTI-LAYER STACK AND METHODS OF FABRICATION

(71) Applicant: INTEL CORPORATION, Santa Clara, CA (US)

(72) Inventors: Timothy Glassman, Portland, OR (US); Dragos Seghete, Portland, OR (US); Nathan Strutt, Beaverton, OR (US); Namrata S. Asuri, Portland, OR (US); Oleg Golonzka, Beaverton, OR (US); Hiten Kothari, Hillsboro, OR (US); Matthew J. Andrus, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 9 days.

(21) Appl. No.: 16/641,588

(22) PCT Filed: Sep. 28, 2017

(86) PCT No.: PCT/US2017/053970
§ 371 (c)(1),
(2) Date: Feb. 24, 2020

(87) PCT Pub. No.: WO2019/066849
PCT Pub. Date: Apr. 4, 2019

(65) Prior Publication Data
US 2020/0203603 A1    Jun. 25, 2020

(51) Int. Cl.
*H01L 45/00* (2006.01)
*H01L 27/24* (2006.01)

(52) U.S. Cl.
CPC .......... *H01L 45/08* (2013.01); *H01L 27/2436* (2013.01); *H01L 45/1233* (2013.01);
(Continued)

(58) Field of Classification Search
CPC  H01L 45/1233; H01L 45/146; H01L 27/2436
See application file for complete search history.

(56) References Cited

U.S. PATENT DOCUMENTS 8,067,762 B2 *  11/2011  Ho ..................... H01L 45/1233
                                          257/E47.001
10,755,779 B2 *  8/2020  Tran ................... G11C 13/0028
(Continued)

FOREIGN PATENT DOCUMENTS

KR          20170099851          9/2017

OTHER PUBLICATIONS

International Search Report and Written Opinion for International Patent Application No. PCT/US17/53970, dated Mar. 8, 2018.
(Continued)

*Primary Examiner* — Mark V Prenty
(74) *Attorney, Agent, or Firm* — Finch & Maloney PLLC

(57) ABSTRACT

A memory device includes a bottom electrode above a substrate, a first switching layer on the bottom electrode, a second switching layer including aluminum on the first switching layer, an oxygen exchange layer on the second switching layer and a top electrode on the oxygen exchange layer. The presence of the second switching layer including aluminum on the first switching layer enables a reduction in electro-forming voltage of the memory device.

20 Claims, 10 Drawing Sheets

(52) U.S. Cl.
CPC ........ *H01L 45/1253* (2013.01); *H01L 45/146* (2013.01); *H01L 45/1625* (2013.01); *H01L 45/1641* (2013.01); *H01L 45/1675* (2013.01)

(56) References Cited

U.S. PATENT DOCUMENTS

| | | |
|---|---|---|
| 10,879,461 B2 * | 12/2020 | Kim .................... H01L 45/1233 |
| 11,050,021 B2 * | 6/2021 | Hsu ....................... H01L 45/147 |
| 2014/0246643 A1 | 9/2014 | Kim et al. |
| 2015/0102279 A1 | 4/2015 | Fujii et al. |
| 2016/0049584 A1 | 2/2016 | Dang et al. |
| 2016/0118441 A1 | 4/2016 | Rawaswamy |
| 2018/0062077 A1 | 3/2018 | Mukherjee et al. |

OTHER PUBLICATIONS

International Preliminary Report on Patentability from PCT/US2017/053970 dated Apr. 9, 2020, 11 pgs.

* cited by examiner

RESISTIVE RANDOM ACCESS MEMORY DEVICE WITH SWITCHING MULTI-LAYER STACK AND METHODS OF FABRICATION

CLAIM OF PRIORITY

This Application is a National Stage Entry of, and claims priority to, PCT Application No. PCT/US17/53970, filed on 28 Sep. 2017 and titled "A RESISTIVE RANDOM ACCESS MEMORY DEVICE WITH SWITCHING MULTI-LAYER STACK AND METHODS OF FABRICATION," which is incorporated by reference in its entirety for all purposes.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely heavily on innovative fabrication techniques to meet the exceedingly tight tolerance requirements imposed by scaling.

Non-volatile on-chip embedded memory with resistive random access memory (RRAM) devices can improve energy and computational efficiency of a system on chip (SOC). However, the technical challenges of creating an appropriate stack for fabrication of RRAM devices with high device endurance, high retention and operate at low voltages and currents present formidable roadblocks to commercialization of this technology. Specifically, the objective of memory technology to control tail bit data in a large array of memory bits necessitates tighter control of the variations in switching layer break down and switching events in individual bits. In filamentary RRAM systems, engineering a switching layer that results in lower break down voltages and in high device endurance is highly advantageous. As such, significant improvements are still needed in switching layer stacks, which rely on material advancements, fabrication techniques, or a combination of both.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 2A illustrates a via formed above a metallization structure that is disposed above a substrate.

FIG. 2B illustrates the structure of FIG. 2A following the formation of a first switching layer on the interconnect metallization, and a second switching layer on the first switching layer.

FIG. 2C illustrates the structure of FIG. 2B following the formation of an oxygen exchange layer, a top electrode layer for a resistive random access memory (RRAM) device formed on an interconnect metallization, and following the formation of a dielectric hardmask layer on the top electrode layer.

FIG. 2D illustrates the structure of FIG. 2C following an etch process used to transfer a resist pattern into the dielectric hardmask layer to form a dielectric hardmask.

FIG. 2E illustrates the structure of FIG. 2D following an etch process to pattern the top electrode layer, the oxygen exchange layer, the first switching layer, the second switching layer and the bottom electrode to form an RRAM device, in an accordance with an embodiment of the present disclosure.

FIG. 2F illustrates the structure of FIG. 2E following the formation of a dielectric spacer layer covering the dielectric hardmask layer and the RRAM device.

FIG. 2G illustrates the structure of FIG. 2F following an anisotropic plasma etch of the dielectric spacer layer to form a dielectric spacer, in an accordance with an embodiment of the present disclosure.

DESCRIPTION OF EXEMPLARY EMBODIMENTS

Figure 1A:
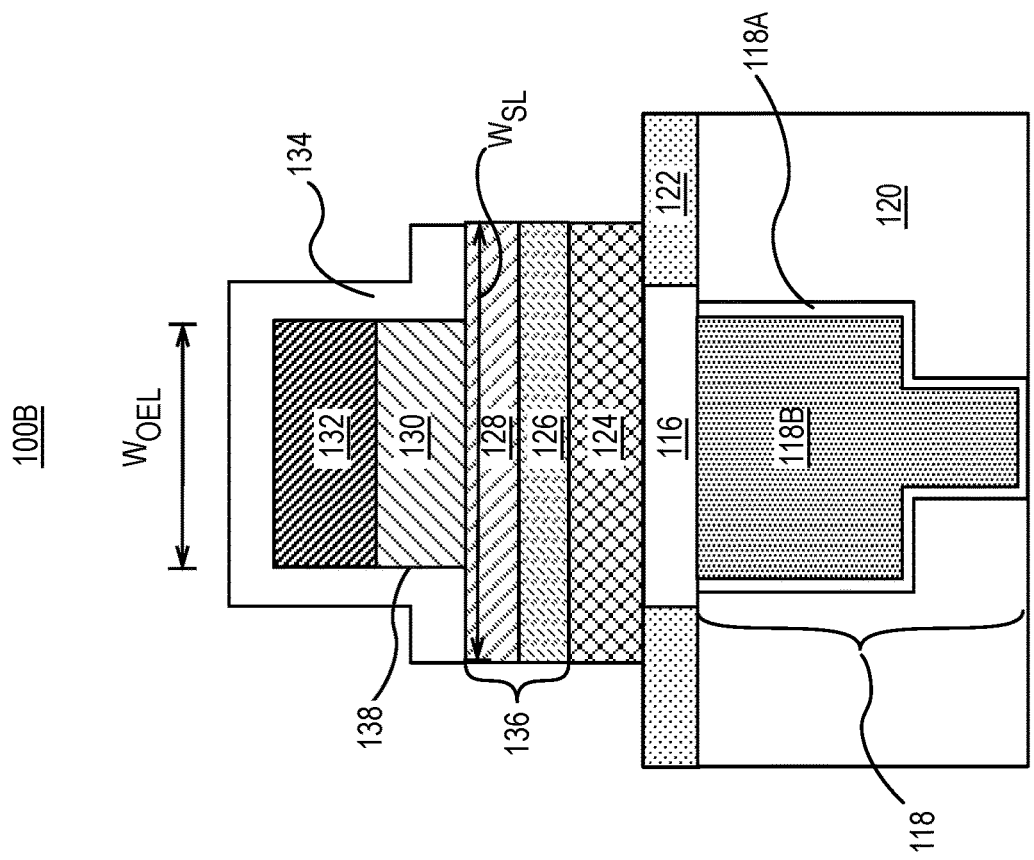
FIG. 1A illustrates a cross-sectional view of a resistive random access memory device including a switching multi-layer, in an accordance with an embodiment of the present disclosure.

A switching multi-layer stack for a resistive random access memory (RRAM) device and methods of fabrication are described. In the following description, numerous specific details are set forth, such as novel structural schemes and detailed fabrication methods in order to provide a thorough understanding of embodiments of the present invention. It will be apparent to one skilled in the art that embodiments of the present invention may be practiced without these specific details. In other instances, well-known features, such as switching operations associated with embedded memory, are described in lesser detail in order to not unnecessarily obscure embodiments of the present invention. Furthermore, it is to be understood that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made and also depends on how the device may be voltage biased. One material "above" a second material is higher within a stack of materials, but footprints of the materials need not overlap. Terms such as "front", "back", "rear", and "side" describe the orientation and/or location of portions of the component within a consistent but arbitrary frame of reference, which is made clear by reference to the text and the associated drawings describing the component under discussion. Such terminology may include the words specifically mentioned above, derivatives thereof, and words of similar import.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, one material "over" a second material has a footprint that overlaps at least a portion of the second material's footprint. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Non-volatile memory devices such as a magnetic tunnel junction (MTJ) memory device or a resistive random-access memory (RRAM) device depend on a phenomenon of resistance switching to store information. The non-volatile memory device functions as a variable resistor where the resistance of the device may switch between a high resistance state and a low resistance state.

Integration of a memory array with low voltage logic circuitry, such as logic circuitry operational at a voltage less than or equal to 1 Volt, may be advantageous since it enables higher operation speeds compared to having physically separate logic and memory chips. Additionally, approaches to integrating an RRAM device with a transistor to create embedded memory presents material challenges that have become far more formidable with scaling. As transistor operating voltages are scaled down in an effort to become more energy efficient, RRAM memory devices that are connected in series with such transistors are also required to function at lower voltages and currents.

Non-volatile memory devices, such as resistive random-access memory (RRAM) devices, depend on a phenomenon of resistance switching to store information. The non-volatile memory device functions as a variable resistor where the resistance of the device may switch between a high resistance state and a low resistance state. Resistance switching relies on a change in conductivity of the RRAM device. In particular, a switching layer determines the conductivity. In one embodiment, the conductivity is modulated by formation and dissolution of a conductive filament in the switching layer. The conductive filament may be created in an RRAM device by a one-time electro-forming process, where a voltage is applied between two electrodes located on either side of the switching layer. The electro-forming process may cause an electrical breakdown within the switching layer leading to a formation of the conductive filament. The electro-forming voltage depends on the material composition and the thickness of the switching layer and may dictate a size of the conductive filament being formed. Minimizing an electroforming voltage below 1.5V is advantageous for embedded memory applications, where an RRAM device may be electrically coupled to a transistor with a capacity to drive a finite current. As the size of the conductive filament determines how much current is required to switch the RRAM device between a high resistance state and a low resistance state, methods to control the size of the filament initially formed are highly desirable. During the process of resistance switching a larger conductive filament may require a larger electrical current to dissolve and re-form the filament than a relatively smaller conductive filament. For a transistor that is coupled with an RRAM device, the maximum current that can be delivered to the RRAM device may fall below that which is required for filament formation and dissolution if the conductive filament becomes too large. In one embodiment, a reduction in forming voltage can be brought about by inserting an oxygen exchange layer between the switching layer and an electrode.

In an accordance with an embodiment of the present disclosure, a switching multi-layer stack including a first switching layer and a second switching layer on the first switching layer can be implemented in an RRAM device, where the conductive filament is formed in the first and in the switching layer simultaneously. This architecture may serve to reduce the forming voltage. In a further embodiment, the first switching layer and the second switching layer each includes a metal and oxygen. In some advantageous embodiments, by combining a first switching layer having a first dielectric constant and a first thickness with a second switching layer having a second dielectric constant and a second thickness, the forming voltage of a RRAM device may be tuned. Furthermore, in one embodiment, the second switching layer may act as an oxygen diffusion barrier preventing a diffusion of oxygen from the first switching layer towards the oxygen exchange layer. Minimizing oxygen diffusion from the first switching layer may influence oxygen vacancy formation and movement during the electro-forming process. FIG. 1A illustrates a cross-sectional view of an RRAM device 100A including a switching multi-layer disposed above a substrate 102, in accordance with an embodiment of the present disclosure. The RRAM device 100A includes a bottom electrode 104, a first switching layer 106 on the bottom electrode 104, a second switching layer 108 on the first switching layer 106, an oxygen exchange layer 110 disposed on the second switching layer 108 and a top electrode 112 disposed on the oxygen exchange layer 110. In the illustrative embodiment, a dielectric spacer film 114 surrounds a sidewall of RRAM device 100A and extends from a lowermost portion of the bottom electrode to an uppermost portion of the top electrode.

In an embodiment, the first switching layer 106 includes oxygen and a metal (M), such as, but not limited to, hafnium, tantalum, zirconium, tungsten or titanium. Exemplary compositions of the first switching layer 106 include hafnium oxide, tantalum oxide, zirconium oxide, titanium oxide and tungsten oxide. Depending on embodiments, the first switching layer 106 may be stoichiometric or non-stoichiometric in oxygen content. For embodiments with hafnium, with an oxidation state +4, the first switching layer 106 has a chemical composition of $MO_X$, where O is oxygen and X is, or is substantially close to, 2, such as between 1.9-2.0. For tantalum embodiments with an oxidation state +5, the first switching layer 106 has a chemical composition of $M_2O_X$, where O is oxygen and X is or is substantially close to 5, such as between 4.90-5.0. For any of these compositions, the thickness of the first switching layer 106 may vary. In one embodiment, the first switching layer 106 has a thickness of at least 2 nm. In another embodiment, first switching layer 106 has a thickness between 2-5 nm.

For any of the embodiments above, the second switching layer 108 advantageously includes aluminum and oxygen, and may be, for example, a layer of aluminum oxide, $Al_2O_3$. The thickness of the first switching layer 106 may also vary. In one embodiment, the second switching layer 108 has a thickness of at least 1.4 nm.

As discussed above, the electro-forming voltage characteristics of the RRAM device 100A is affected by the switching layer and may be affected by the dielectric constant of the switching layer material. In the examples above, the dielectric constant of aluminum oxide is less than the dielectric constant of hafnium oxide, tantalum oxide, zirconium oxide, titanium oxide and tungsten oxide. An $Al_2O_3$—second switching layer 108 including may support breakdown at a lower electro-forming voltage compared to a non—$Al_2O_3$ first switching layer 106. However, $Al_2I_{3\ has}$ a larger bandgap than many metal oxides including hafnium oxide, tantalum oxide, zirconium oxide, titanium oxide and tungsten oxide. A larger band gap favors a higher dielectric breakdown voltage and may increase the effective resistance of the RRAM device 100A. Although the presence of a stronger insulator may not directly affect electro-forming voltages, resistance switching after a one time electro-forming process may be adversely affected when a switching layer is a stronger insulator. Thus, a device architecture with switching multi-layers including a first switching layer 106 capable of supporting low voltage resistance switching, and a second switching layer 108 having a lower dielectric constant may be beneficial.

The $Al_2O_3$ switching layer may have an oxygen concentration gradient. In one such embodiment, the concentration gradient has a higher concentration of oxygen proximate to the $Ta_2O_5$ and a lower concentration of oxygen distal from the $Ta_2O_5$. Such an arrangement may preferably provide greater oxygen vacancies in a location that aids with filament formation and dissolution. In another embodiment, there is no oxygen concentration gradient.

The electro-forming voltage of the RRAM device 100A may be lowered by as much as 200 mV by tuning the relative thicknesses of the first switching layer 106 and the second switching layer 108. In one embodiment, first switching layer 106 has a thickness between 2 nm and 4 nm and the second switching layer 108 has a thickness between 1.4 nm and 2 nm. In one such embodiment, the first switching layer 106 and the second switching layer 108 have a total combined thickness between 3.4 nm and 5 nm. In an embodiment, the first switching layer 106 is $Ta_2O_5$ and the second switching layer 108 is $Al_2O_3$. In an exemplary embodiment, the first switching layer 106 is $Ta_2O_5$ having a thickness of at least 3.2 nm but less than 3.8 nm and the second switching layer 108 is $Al_2O_3$ having a thickness of at least 1.2 nm but less than 1.8 nm. In an embodiment, the oxygen exchange layer 110 acts as a source of oxygen vacancies or as a sink for oxygen atoms as well as a barrier layer against oxygen out diffusion from the second switching layer 108. In filamentary RRAM systems, variation in switching voltage for a single RRAM device may be modulated by fine tuning oxygen vacancy concentration, which is widely understood to drive filament formation and dissolution in metal oxide films. In an embodiment, the oxygen exchange layer 110 includes a metal such as but not limited to, tungsten, hafnium, tantalum or titanium. In an embodiment, the oxygen exchange layer 110 and the first switching layer 106 includes a same metal. In an embodiment, oxygen exchange layer 110 has a thickness between 5 nm and 20 nm. In an embodiment, the thickness of the oxygen exchange layer 110 is at least one and half times the thickness of the first switching layer 106.

The bottom electrode 104 may include materials that are crystalline, columnar or amorphous in nature. In an embodiment, the bottom electrode 104 is a topographically smooth electrode and may prevent abrupt filament formation. Exemplary compositions of the bottom electrode 104 may include a material such as W, Ta, TaN or TiN. In a specific embodiment, the bottom electrode 104 is composed of one or more Ru layers interleaved with one or more Ta layers. Depending on embodiments, the bottom electrode 104 has a thickness between 10 nm-50 nm. Exemplary compositions of the top electrode 112 includes a material such as W, Ta, TaN or TiN. Depending on embodiments, the top electrode 112 has a thickness between 20-70 nm. In an embodiment, the bottom electrode 104 and the top electrode 112 include a same metal such as Ta or TiN.

In an embodiment, a portion of an interface 105 between the bottom electrode 104 and the first switching layer 106 is oxidized. In one such embodiment, when the bottom electrode 104 includes tungsten, ruthenium or titanium nitride and an oxidized uppermost portion of the bottom electrode 104 remains conductive.

The dielectric spacer 114 may be any suitable dielectric material such as but not limited to carbon doped silicon nitride or silicon nitride. In an embodiment, the dielectric material of the dielectric spacer 114 is a non-oxygen-containing material utilized to prevent oxidation of the oxygen exchange layer. In an embodiment, the dielectric spacer 114 has a thickness that ranges from 10 nm-50 nm.

The illustrative embodiment of FIG. 1A, further depicts a via 116 directly below the RRAM device 100A, where the via 116 is coupled with an interconnect metallization 118 disposed in a dielectric layer 120 above the substrate 102. Such an interconnect metallization 118 may include lateral runs (e.g., metallized trenches within dielectric) and vertical runs (e.g., metallized vias). In an embodiment, the via 116 is surrounded by a passivation layer 122. In an embodiment, the passivation layer 122 is disposed on a portion of the interconnect metallization 118 and on the dielectric layer 120.

Referring again to FIG. 1A, via 116 includes a material such as but not limited to W, TiN, TaN, Ru or Ta. In an embodiment, the via 116 has a thickness between 10 nm-20 nm. As shown, the via 116 has a width, $W_{IV}$. In an embodiment, $W_{IV}$, of the via 116 is less than the width, $W_{BE}$, of the bottom electrode 104. In an embodiment, $W_{IV}$, of the via 116 is more than the width, $W_{BE}$, of the bottom electrode 104. In an embodiment, the passivation layer 122 includes a material such as but not limited to silicon nitride, silicon carbide, or carbon-doped silicon nitride. In an embodiment, the via 116 and the passivation layer 122 have uppermost surfaces that are co-planar or substantially co-planar.

Referring again to FIG. 1A, in an embodiment, the interconnect metallization 118 has an uppermost surface that is coplanar or substantially co-planar with an uppermost surface of the dielectric layer 120. In an embodiment, the interconnect metallization 118 includes a barrier layer 118A, and a fill metal 118B disposed on the barrier layer. In an embodiment, the barrier layer 118A includes a material such as but not limited to tantalum nitride, tantalum or ruthenium. In an embodiment, the fill metal 118B includes a metal such as W or Cu. In an embodiment, the interconnect metallization 118 has a width, $W_{IM}$ that is greater than the width, $W_{IV}$, of the via 116. In embodiment, the interconnect metallization 118 has a width, $W_{IM}$ that is greater than the width, $W_{BE}$, of the bottom electrode 104. In an embodiment, the interconnect metallization 118 has a width, $W_{IM}$ that is substantially similar to the width, $W_{BE}$, of the bottom electrode 104. In an embodiment, the interconnect metallization 118 has a width, $W_{IM}$ that is less than the width, $W_{BE}$, of the bottom electrode 104. In an embodiment, $W_{IM}$, is between 20 nm-50 nm. In an embodiment, $W_{BE}$, is between 20 nm-50 nm. In an embodiment, $W_{V}$, is between 20 nm-50 nm.

In an embodiment, the dielectric layer 120 may include oxygen and silicon, with examples including silicon dioxide ($SiO_2$), carbon doped oxide (CDO), and silicon nitride. Dielectric layer 120 may also include organic polymers such as perfluorocyclobutane or polytetrafluoroethylene, fluorosilicate glass (FSG), and organosilicates such as silsesquioxane, siloxane, or organosilicate glass. In an embodiment, the total thickness of dielectric layer 120 is between 30 nm-100 nm.

In an embodiment, the substrate 102 includes a suitable semiconductor material such as but not limited to, single crystal silicon, polycrystalline silicon and silicon on insulator (SOI). In another embodiment, substrate 102 includes other semiconductor materials such as germanium, silicon germanium or a suitable group III-V compound. Logic devices such as MOSFET transistors and access transistors and may be formed on the substrate 102. Logic devices such as access transistors may be integrated with memory devices such as the RRAM device 100A to form embedded memory. Embedded memory including RRAM devices and logic MOSFET transistors can be combined to form functional integrated circuits such as a system on chip (SOC) and microprocessors.

Figure 1B:
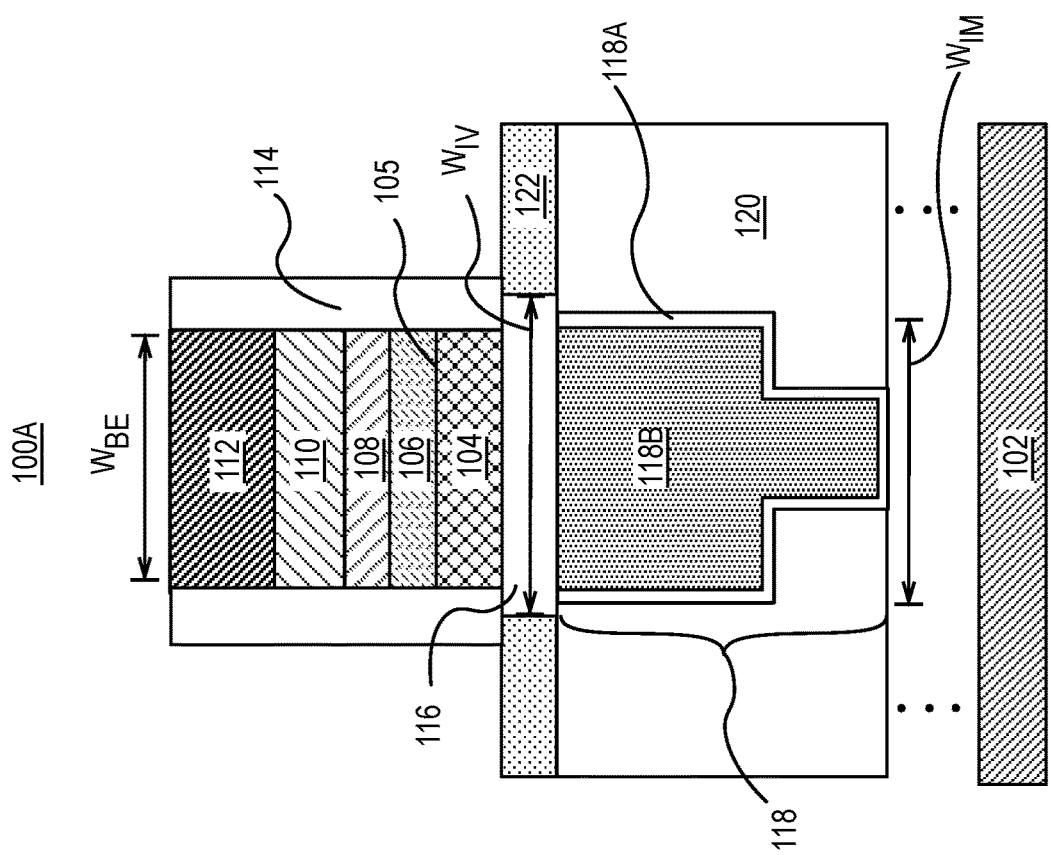
FIG. 1B illustrates a cross-sectional view of a resistive random access memory device including a switching multi-layer and an oxygen exchange layer where the oxygen exchange layer has a smaller lateral dimension than a lateral dimension of the dual switching layer, in an accordance with an embodiment of the present disclosure.

FIG. 1B illustrates an RRAM device 100B that is a variation of the RRAM device 100A depicted in FIG. 1A, where an oxygen exchange layer 130 has a smaller lateral dimension than a lateral dimension of the second switching layer 128, and a lateral dimension of the first switching layer 126. The RRAM device 100B further includes a bottom electrode 124 and a top electrode 132. In an embodiment, the first switching layer 126 and the second switching layer 128 are the same or substantially the same as the first switching layer 106 and the second switching layer 108, respectively. In an embodiment, the bottom electrode 124 is the same or substantially the same as the bottom electrode 104. In the illustrative embodiment, the bottom electrode 124 extends over the via 116 and the passivation layer 122.

In the illustrative embodiment, the oxygen exchange layer 130 has a lateral dimension, $W_{OEL}$, that is smaller than a lateral dimension of the second switching layer 128, $W_{SL}$. The first switching layer 126 and the bottom electrode 124 each have lateral dimensions that are the same or substantially the same as the lateral dimension, $W_{SL}$, of the second switching layer 128. As depicted in FIG. 1B, the top electrode 132 has a lateral dimension that is the same as the lateral dimension of the oxygen exchange layer 130. In an embodiment, $W_{OEL}$, is between 10 nm-20 nm. In an embodiment, $W_{SL}$, is between 20 nm-50 nm.

Depending on embodiments, a sidewall 136 of the first switching layer 126 and the second switching layer 128 may be rough and may adversely impacted repeated formation and dissolution (cycling) of the conductive filaments during cycling of RRAM device 100B. Surface roughness on sidewall 136 may promote errant switching because of the high level of variability in the size and shape of the filament created proximate to the sidewall 136. When the sidewall 136 is distant from a sidewall 138 of the oxygen exchange layer 130, any filaments created in the first switching layer 126 and in the second switching layer 128 may be confined to a region under the oxygen exchange layer 130 where an electric field is highest. Thus, localizing filaments away from sidewall 136 may promote a greater number of repetitions of cycling (endurance) over a lifetime of the RRAM device 100B.

In the illustrative embodiment of FIG. 1B, a dielectric spacer layer 134 surrounds a sidewall of the oxygen exchange layer 130 and uppermost portion of the top electrode 132 and is further disposed on a portion of the second switching layer 128. The dielectric spacer layer 134 is the same or substantially the same as the dielectric spacer layer 114. Dielectric spacer layer 134 may prevent oxidation of the oxygen exchange layer by sources external to the RRAM device 100B.

FIGS. 2A-2G illustrate cross sectional views representing various operations in a method of fabricating an RRAM device such as the RRAM device 100A integrated on a metallization structure, in accordance with some embodiments of the present disclosure.

Figure 2B:
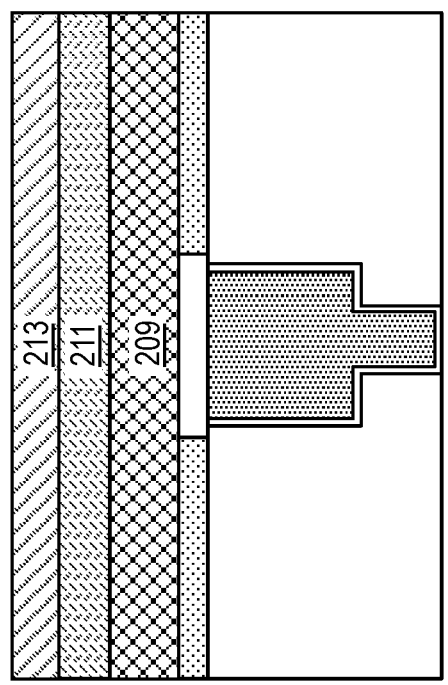
FIGS. 2A-2G illustrate cross sectional views representing various operations in a method of fabricating a resistive random access memory device integrated on an interconnect metallization, in accordance with an embodiment of the present disclosure.
Figure 2A:
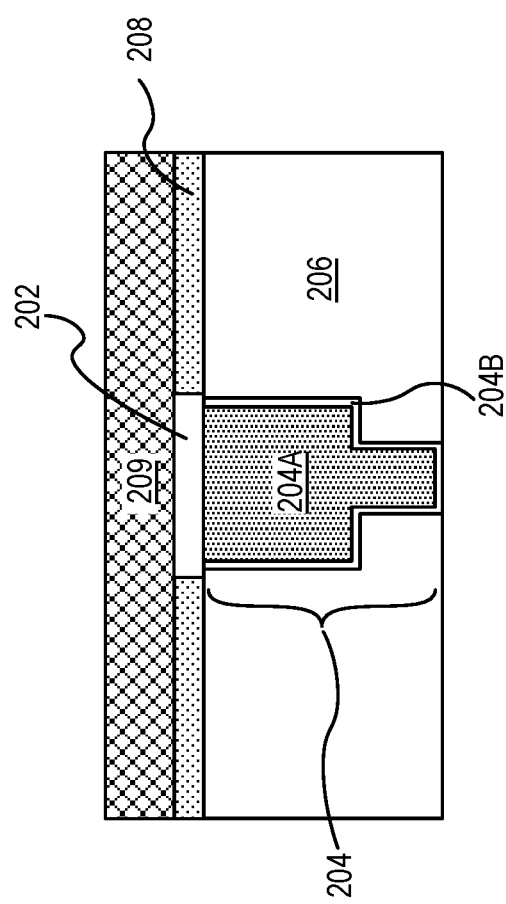

FIG. 2A illustrates a via 202 on a metallization structure 204 formed in a first dielectric layer 206 above a substrate, in accordance with an embodiment of the present disclosure. The metallization structure 204 may be formed by a damascene or a dual damascene process. In an embodiment, the metallization structure 204 is the same as or substantially the same as the interconnect metallization 118 described in association with FIG. 1A. In an embodiment, the metallization structure 204 includes a barrier layer 204A, and a fill material 204B disposed on the barrier layer 204A. In an embodiment, the first dielectric layer 206 is the same as or substantially the same as the dielectric layer 120 described in association with FIG. 1A.

In an embodiment, the via 202 is formed by blanket depositing a layer of a metal or a metal alloy on the metallization structure 204, and patterning the layer of the metal or metal alloy. In an embodiment, the patterning process includes plasma etching the metal or a metal alloy to form the via 202 over a portion of the metallization structure 204. In an embodiment, the via 202 includes a material that is the same as or substantially the same as the material of the via 116 described in association with FIG. 1A.

In an embodiment, a passivation layer 208 is formed by blanket depositing a layer of an insulating material on the via 202 and on the first dielectric layer 206, and then planarizing the insulating material to expose the via 202.

In an embodiment, the planarization process results in the via 202 having an uppermost surface that is coplanar or substantially coplanar with an uppermost surface of the passivation layer 208. In an embodiment, the planarization process includes a polish process. In an embodiment, the passivation layer 208 includes a material that is the same as or substantially the same as the material of the passivation layer 122 described in association with FIG. 1A. In an embodiment, the bottom electrode layer 209 is deposited on the uppermost surface of the via and on the uppermost surface of the passivation layer 208. In an embodiment, the bottom electrode layer 209 is blanket deposited by a physical vapor deposition (PVD), a chemical vapor deposition (CVD), a plasma enhanced chemical vapor deposition (PECVD) or an atomic layer deposition process (ALD). In an embodiment, the bottom electrode layer 209 includes a metal such as but not limited to W, Ru, Ti or Ta or an alloy such as but not limited to WN, TiN or TaN. In an embodiment, the bottom electrode layer 209 includes a layer of TiN, deposited by a PVD process. In one embodiment, a layer of TiN deposited by a PVD process results in a layer having low electrical resistivity such as an electrical resistivity between 100-250µ-Ω-cm. FIG. 2B illustrates the structure of FIG. 2A following the formation of a first switching layer 211 on the bottom electrode layer 209, and a second switching layer 213 on the first switching layer 211. In an embodiment, the first switching layer 211 is a material that includes oxygen and a metal such as, but limited to, $HfO_2$, $Ta_2O_5$, $TiO_2$ and $ZrO_2$. In an embodiment, the first switching layer 211 is a stoichiometric oxide of the metal such as Hf, Ta, Ti and Zr. In an embodiment, a first switching layer 211 that is stoichiometric is formed using an atomic layer deposition (ALD) process. The ALD process may be characterized by a slow and a controlled deposition rate resulting in a metal oxide film with a stoichiometric oxygen content. In an embodiment, the first switching layer 211 is deposited using a physical vapor deposition (PVD) process. The PVD process may include depositing a metal oxide film in an ambient containing oxygen flowing at a constant or at a variable rate. Such a deposition process may form a first switching layer 211 that is slightly deficient in oxygen concentration resulting in a film that is non-stoichiometric in oxygen content. The first switching layer 211 is deposited to a thickness between 2 nm-5 nm.

In some embodiments where the second switching layer 213 is stoichiometric $Al_2O_3$ deposited by an ALD process. In an embodiment, an $Al_2O_3$ $_{second}$ switching layer 213, is deposited on the first switching layer 211 by PVD process in an ambient containing oxygen flowing at a constant or at a variable rate. When the first switching layer 211 includes a non-stoichiometric metal oxide deposited by a PVD process, the second switching layer 213 may also be deposited sequentially, without a vacuum break, by a PVD process in an ambient containing oxygen flowing at a constant or at a variable rate. In one example, the oxygen flow can be decreased or increased during the deposition process to create an $Al_2O_3$ layer having an oxygen concentration gradient. In an exemplary embodiment, a layer of $Al_2O_3$ is deposited on a layer of $Ta_2O_5$. In one such exemplary embodiment, the concentration gradient has a higher concentration of oxygen proximate to the $Ta_2O_5$ and a lower concentration of oxygen distal from the $Ta_2O_5$. Such an arrangement may preferably provide greater oxygen vacancies in a location that aids with filament formation and dissolution. In another embodiment, there is no oxygen concentration gradient.

Figure 2D:
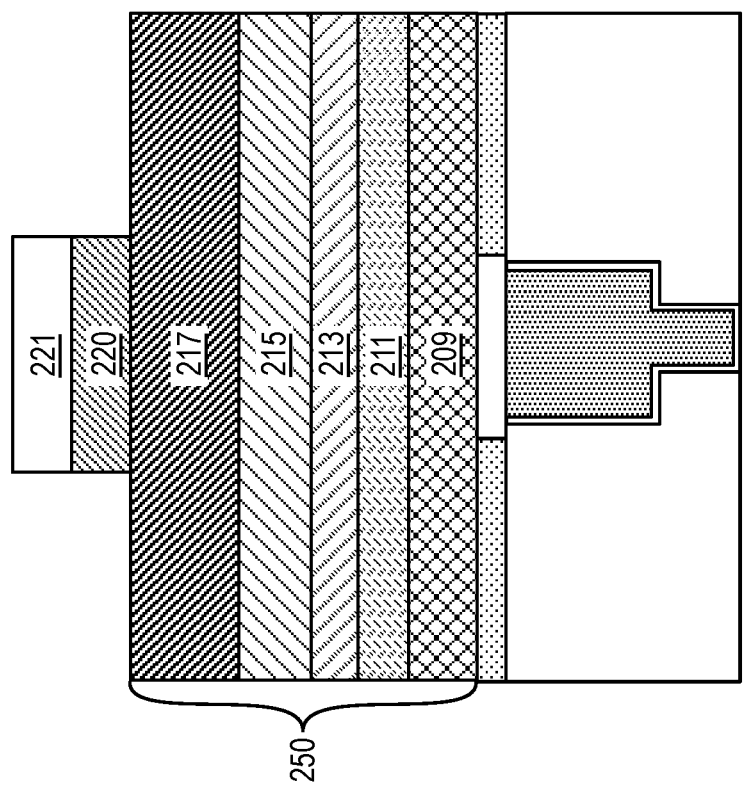
Figure 2C:
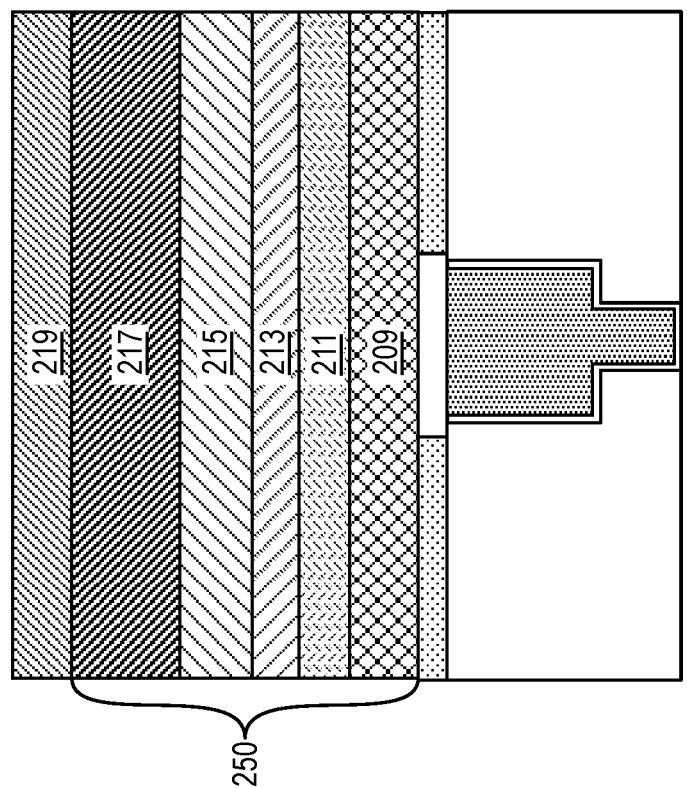

FIG. 2C illustrates the structure of FIG. 2B following the formation of an oxygen exchange layer 215 and a top electrode layer 217 and a dielectric hardmask layer 219 on the top electrode layer 217. The oxygen exchange layer may include a material having a composition and a thickness such as is described above in association with the oxygen exchange layer 110. In an embodiment, the oxygen exchange layer 215 is blanket deposited on the second switching layer 213, for example using a PVD process. In one such embodiment, the oxygen exchange layer 215 is deposited sequentially after depositing the second switching layer 213, in a same chamber or in a same tool without breaking vacuum.

Referring again to FIG. 2C, a top electrode layer 217 is deposited on the oxygen exchange layer 215. In an embodiment, the top electrode layer 217 includes a material that is the same as or substantially the same as the material of the top electrode 112 (FIG. 1A). The top electrode layer 217 may be deposited using a PVD process. In one example the top electrode layer 217 and the oxygen exchange layer 215 are deposited sequentially in a same chamber or in a same tool without breaking vacuum. Sequential deposition without an air-break may prevent an uppermost portion of the oxygen exchange layer 215 from becoming oxidized. Oxidation of the oxygen exchange layer can introduce variability in electro-forming voltage and variability in switching voltages during RRAM device operation.

A dielectric hardmask layer 219 deposited over top electrode layer 217 may include any material sufficient to act as an insulator layer and mask a subsequent etching of the RRAM material layer stack 250. Upon deposition of the dielectric hardmask layer 219, the RRAM material layer stack 250, may be subjected to a high temperature anneal process. In an embodiment, anneal temperatures reach 400° C. and last for a time period of 60 minutes. Annealing is a thermal phenomenon that may drive the oxygen from the first switching layer 211 and the second switching layer 213, thus creating oxygen vacancies, $V_o$, in the switching layers. The oxygen from the first switching layer 211 and the second switching layer 213 may diffuse toward the oxygen exchange layer 215 above. The anneal may increase the $V_o$ density in a stoichiometric switching layer priming it for a conductive filament creation.

FIG. 2D illustrates the structure of FIG. 2C following an etch process used to transfer a resist pattern 221 into the dielectric hardmask layer 219 to form a hardmask 220. In an embodiment, an anisotropic plasma etch process is used to pattern the dielectric hardmask layer 219 with selectivity to the resist mask 221. It is to be appreciated that polymeric films, which may result from the interaction between a photoresist material and etch byproducts during memory device etch, may adhere to the sidewall portions of an etched RRAM material stack. If portions of such polymeric layers have metallic components, device performance may be significantly degraded. In one embodiment, the resist mask 221 is removed after forming the hardmask 220 but prior to etching RRAM material layer stack 250. In an embodiment, the resist mask 221 is removed using an ash process.

Figure 2F:
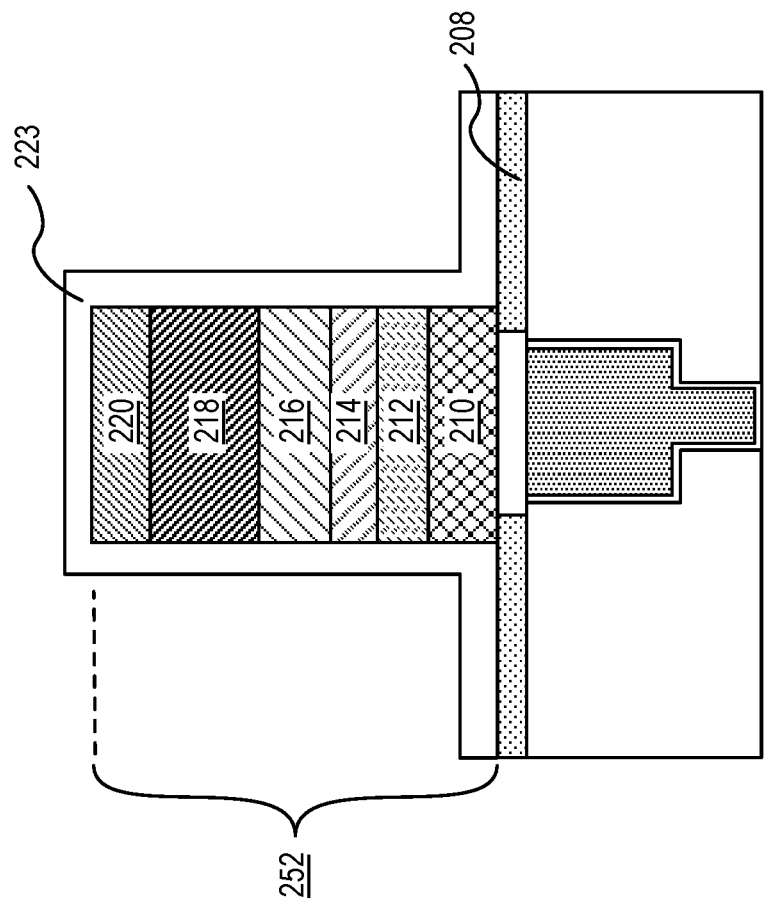
Figure 2E:
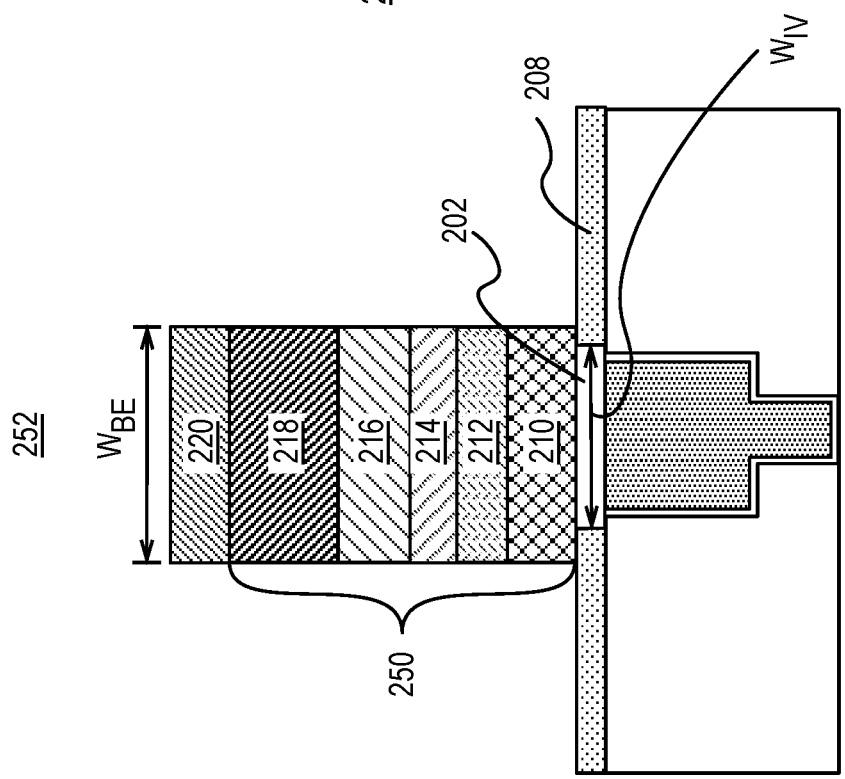

FIG. 2E illustrates the structure of FIG. 2D following an etch process to form an RRAM device 252, in accordance with an embodiment of the present disclosure. In an embodiment, etch process is continued to transfer the hardmask 220 to pattern the top electrode 217 layer, the oxygen exchange layer 215, the second switching layer 213, the first switching layer 211, and the bottom electrode layer 209. The etch process forms a patterned top electrode 218, an oxygen exchange layer 216, a second switching layer 214, a first switching layer 212 and a bottom electrode 210. In an embodiment, the plasma etch process exposes an uppermost surface the passivation layer 208. In the illustrated embodiment, the RRAM device 252 has a width $W_R$, that is greater than a width of the via, $W_{IV}$, however, $W_R$ may be smaller than $W_{IV}$ in other embodiments.

FIG. 2F illustrates the structure of FIG. 2E following the formation of a dielectric spacer layer 223 covering the RRAM device 252. In an embodiment, a dielectric spacer layer 223 is deposited immediately following the plasma etch process without breaking vacuum. In an embodiment, the dielectric spacer layer 223 is deposited in the same tool or chamber used for the etch process. Such a procedure, known in the art, as in-situ deposition, may hermetically seal the device and potentially decrease oxidation of oxygen-sensitive layers. In an embodiment, the dielectric spacer layer 223 includes a material such as but not limited to, silicon nitride, silicon carbide, carbon-doped silicon nitride, or any suitable non-oxygen containing material. In an embodiment, the dielectric spacer layer has a thickness between 10 nm and 50 nm.

Figure 2G:
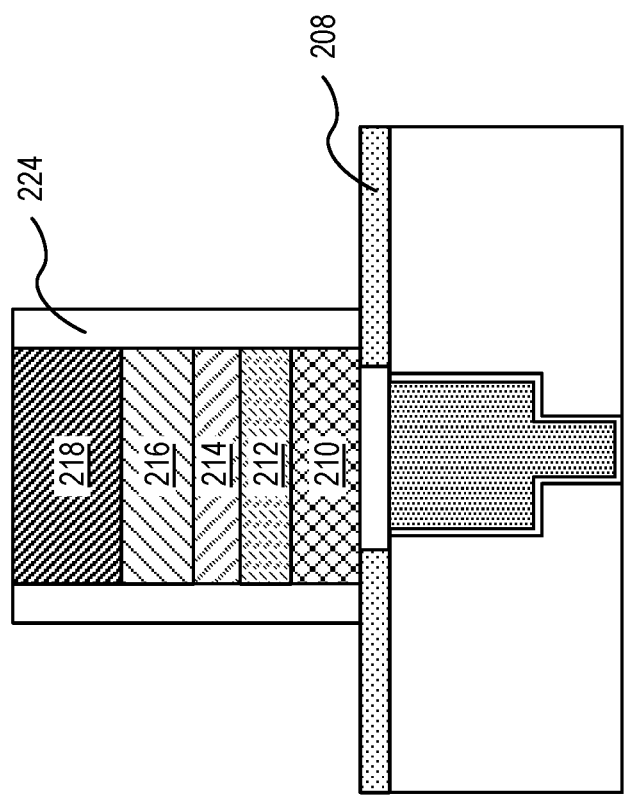

FIG. 2G illustrates the structure of FIG. 2F following an anisotropic plasma etch of the dielectric spacer layer 223 to form a dielectric spacer 224, in an accordance with an embodiment of the present disclosure. In the illustrative embodiment, the hardmask 220 includes a material that is substantially similar to the material of the dielectric spacer 224, and is removed by the anisotropic plasma etch process.

Figure 3:
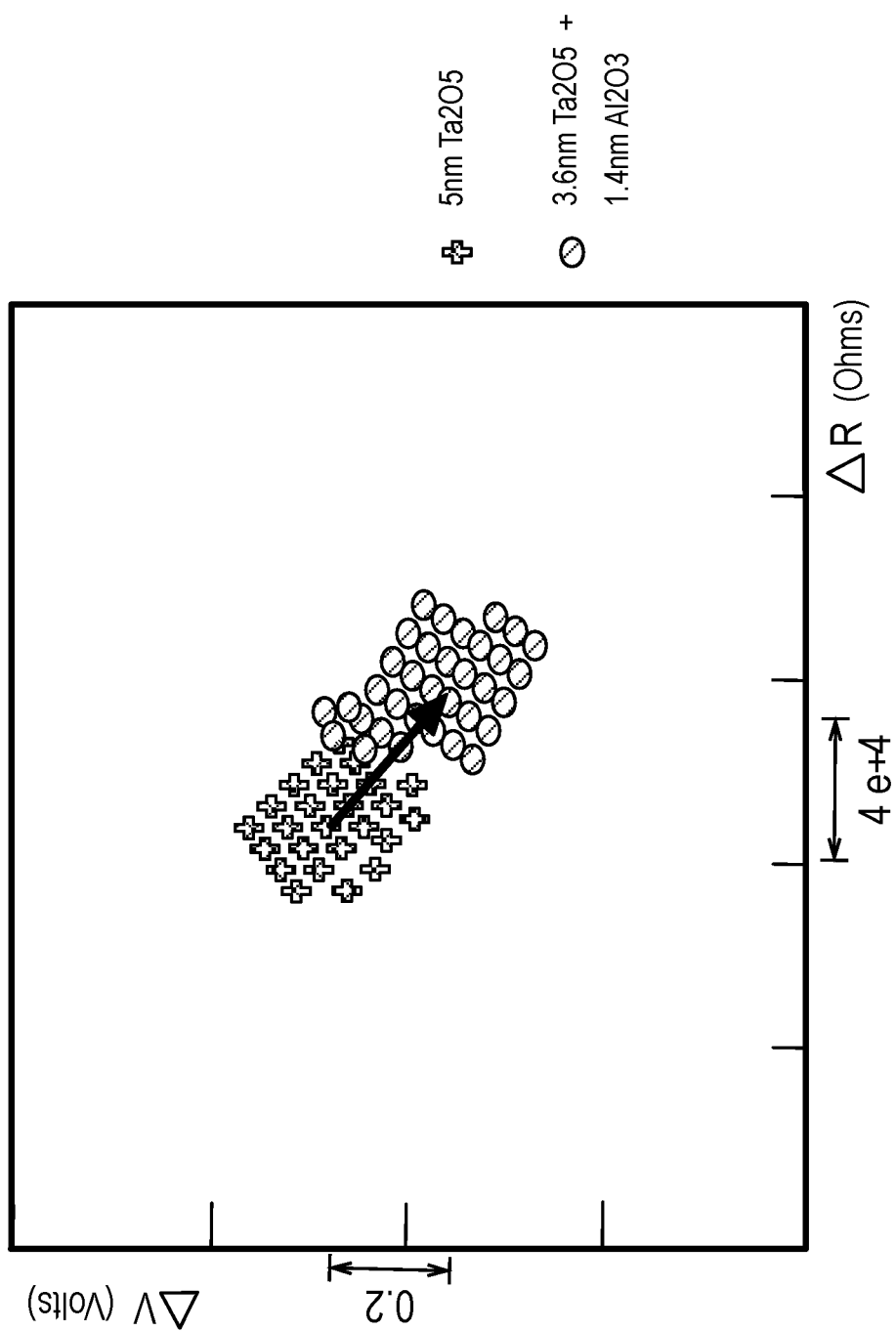
FIG. 3 illustrates a plot comparing forming voltages for an RRAM device having a single switching layer with forming voltage of an RRAM device having a switching multi-layer, in an accordance with an embodiment of the present disclosure.

FIG. 3 illustrates a plot comparing forming voltages for RRAM devices having a single switching layer with forming voltage of an RRAM device having a first switching layer and a second switching layer, such as the RRAM device 100A or 100B, in an accordance with an embodiment of the present disclosure. The reference RRAM device having a single switching layer may be similar to RRAM device 100A, but without the second switching layer 108. As shown, the RRAM device having a single switching layer exhibits a range of electro-forming voltages with a greater absolute maximum that the RRAM device 100A. By thinning down the layer of $Ta_2O_5$ from 5 nm to 3.6 nm and adding a layer of $Al_2O_3$, having a thickness of 1.4 nm the average electro-forming voltage is reduced. In the exemplary embodiment, the average forming voltage is reduced by at least 200 mV.

In one example, when the layer of $Ta_2O_5$ is thinned down from 5 nm to 3.6 nm and a layer of $Al_2O_3$, having a thickness of 1.4 nm is added above the $Ta_2O_5$, the electro-forming resistance of the RRAM device 100A increases by at least 40 KOhm. The increase in electro-forming resistance may be brought about by replacing a 1.4 nm portion of the $Ta_2O_5$ layer by a layer of $Al_2O_3$, having substantially the same thickness.

Since, the electro-forming voltage is proportional to thickness of the switching material, further reduction in electroforming voltage may be obtained by replacing for example, a 1.4 nm portion of the $Ta_2O_5$ layer by a layer of $Al_2O_3$, having substantially the same thickness.

Figure 4B:
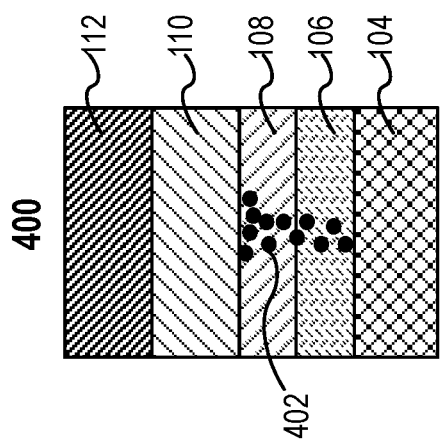
FIG. 4B illustrates a cross-sectional view of a conductive filament formed in an RRAM device, in an accordance with an embodiment of the present invention
Figure 4C:
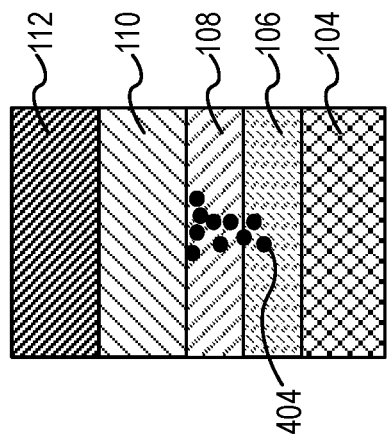
FIG. 4C illustrates a cross-sectional view of an RRAM device where the conductive filament is broken, in an accordance with an embodiment of the present invention.
Figure 4A:
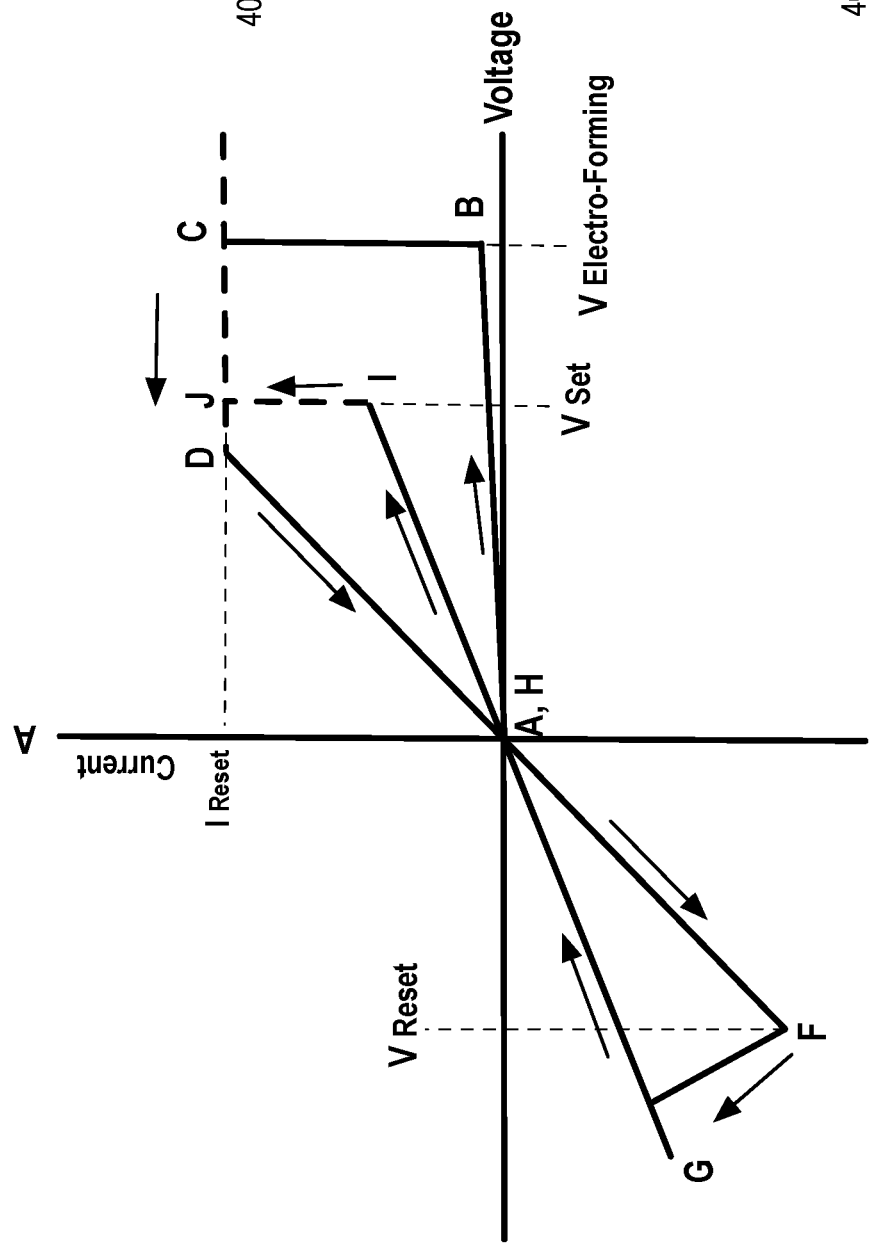
FIG. 4A illustrates an I-V plot, demonstrating concepts involved with filament formation and voltage cycling (reading and writing) in an RRAM device, in accordance with embodiments of the present invention.

FIG. 4A illustrates an I-V plot, demonstrating concepts involved with filament formation and voltage cycling (reading and writing) in an RRAM device, such as an RRAM device 400 depicted in FIG. 4B, in accordance with embodiments of the present invention. RRAM device 400 is the same or substantially the same as the RRAM device 100A. The initial operation of the RRAM device 400 begins by applying a voltage, between the top electrode 112 and the bottom electrode 104, that increases in magnitude until it reaches a value $V_{Electro\text{-}Forming}$ (point A to B). In an embodiment, $V_{Electro\text{-}Forming}$ is less than 1.6V. In an "intentional" one-time breakdown process, known as electro-forming, oxygen vacancies, $V_o$, are removed from the oxygen exchange layer 110 into the second switching layer 108 and into the first switching layer 106 to augment the vacancies created during the anneal process described above. Movement of vacancies in response to an electric field generated in the RRAM device 400 leads to a formation of a "conductive filament" in the second switching layer 108 and in the first switching layer 106. In an embodiment, the conductive filament may extend across first and second switching layers 106 and 108, respectively (point B).

FIG. 4B depicts an illustration of a filament 402 in the RRAM device 400, in an accordance with an embodiment of the present disclosure. It is to be appreciated that a size of the filament 402 may be determined by resistance of the RRAM device before the process of electro-forming and by the electroforming voltage. With a conductive filament, bridging from the top electrode 112 to the bottom electrode 104, the RRAM device 400 is said to be almost immediately conductive. Referring again to the I-V plot, RRAM device 400 becomes conductive and the current through the RRAM device starts to increase (point B to C), until it reaches a predetermined compliance current, $I_{Comp}$. The current through the RRAM device 400 does not continue to increase beyond $I_{Comp}$. In an embodiment, when the RRAM device is coupled with a transistor, $I_{Comp}$ may be the maximum current that the transistor can deliver to the RRAM device 400. At point C, the RRAM device 400 is in a low resistance state.

By reducing the magnitude of the voltage (while maintaining a positive polarity) between the top electrode 112 and bottom electrode 104 (moving from point C to D and then to point A), causes a reduction in a strength of the electric field. By applying a voltage of an opposite polarity between the top electrode 112 and bottom electrode 104 (moving from point A to F), causes a reversal in a direction of the electric field. In response to the change in the direction of the electric field, the oxygen vacancies move towards the oxygen exchange layer 110, leading to a dissolution of the conductive filament in the second switching layer 108 and in the first switching layer 106. Filament dissolution takes place at a critical voltage (point F), termed $V_{Reset}$. In an embodiment, $V_{Reset}$ is between –0.8 V and –1.0 V. Increasing the magnitude of the voltage beyond $V_{Reset}$ changes the current flowing through the device. With a dissolved filament, the current through the RRAM device 400 decreases dramatically and the device returns to a high resistance state (point G). FIG. 4C depicts an illustration of a dissolved filament 404 in the RRAM device 400, in an accordance with an embodiment of the present disclosure.

Referring again to the I-V plot in FIG. 4A, it is to be appreciated that the high resistance level of the RRAM device, point G, is different and lower in magnitude compared to the resistance level of the device before the onset of the forming process. In other words, the resistance level of the RRAM device 400 in a high resistance state can be over 10 times smaller than the virgin resistance (discussed above). By decreasing the magnitude of the voltage, traversing from point G to H and then to point I in the I-V plot, the dissolved filament is recreated again (at point I) under the action of vacancy migration. At a critical voltage, $V_{Set}$, the filament completely bridges the top electrode 112 and the bottom electrode 104 and current begins to flow through the RRAM device. In an embodiment, $V_{Set}$ is less than 1.0 V. The RRAM device is, once again, said to be in a conductive or a low resistance state (at point J). The filament, that is recreated at point J, may have a size that is comparable to the size of the filament formed during the electro-forming process.

The cycling of an RRAM device 400 in this manner, where the resistance levels remain unchanged when the voltage between the top electrode 112 and the bottom electrode 104 is set to 0V, leads to realization of non-volatile memory. By increasing the magnitude of the voltage to at least 0.0.05V, the resistance state of the RRAM device 400 can be read. In one example, a voltage of 0.05V to 0.2V, referred to as a read voltage, $V_R$, is much less than the switching voltage ($V_{Set}$ or $V_{Reset}$) and does not perturb the resistance state of the RRAM device 400. It is to be appreciated that the values $V_{Set}$ and $V_{Reset}$ generally refer to a portion of a voltage that may be applied to a transistor in series with the RRAM device 400. The RRAM device 400 coupled with a transistor in this manner is given the term embedded memory.

Figure 5:
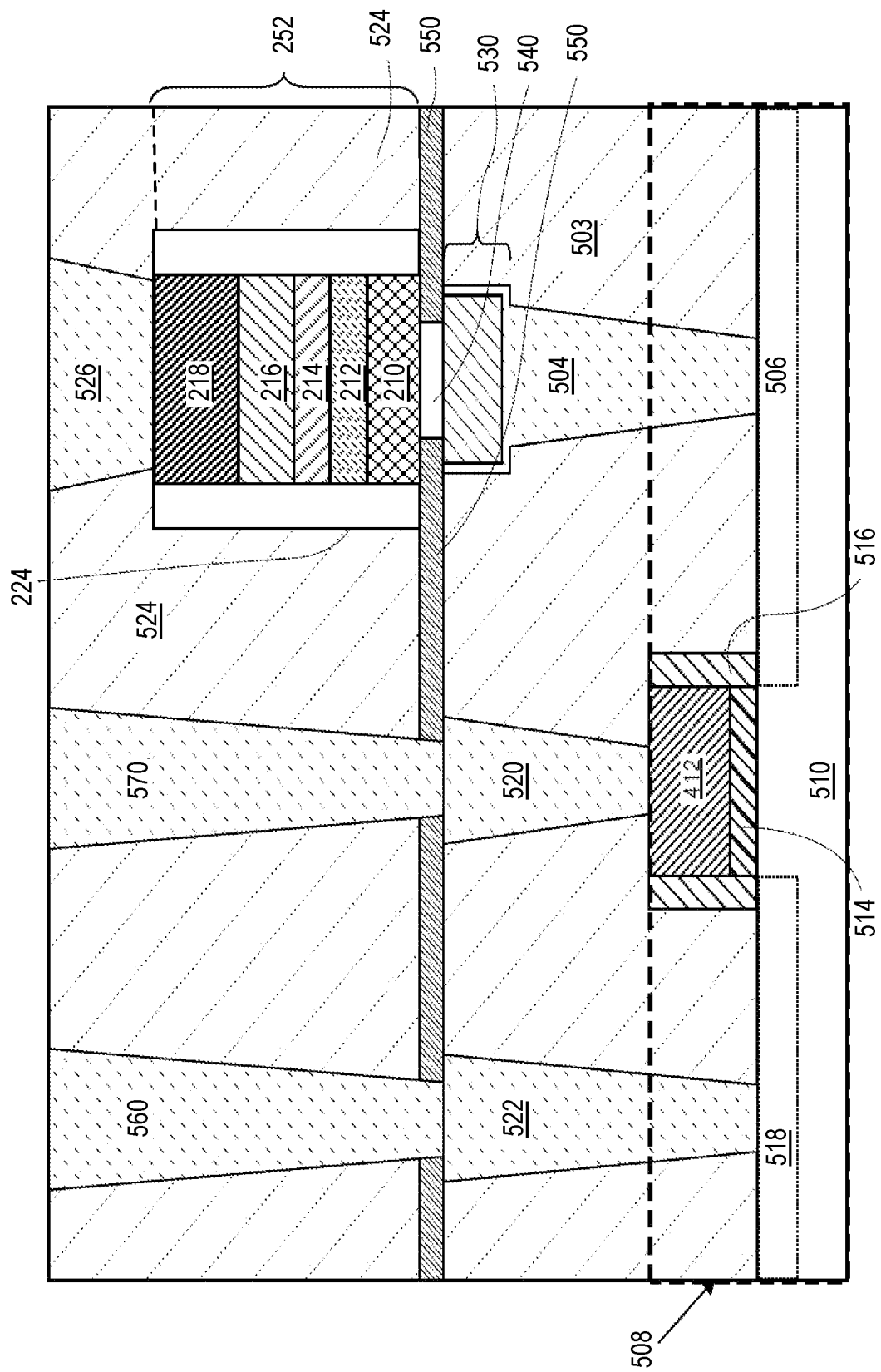
FIG. 5 illustrates a cross-sectional view of an RRAM element coupled to a drain side of a select transistor, in accordance with an embodiment of the present invention.

FIG. 5 illustrates a cross-sectional view of an RRAM device such as the RRAM device 252 formed above a metallization structure 530 coupled to an access transistor 508, in accordance with an embodiment. RRAM device 252 includes the bottom electrode 210, the first switching layer 214, the second switching layer 216, the oxygen exchange layer 216, and the top electrode 218.

The RRAM device 252 is disposed on a via 540 and on a portion of a passivation layer 550. In an embodiment, the via 540 includes a material that is the same as or substantially the same as the material of the via 202 described in association with FIG. 2A. In an embodiment, the passivation layer 550 includes a material that is the same as or substantially the same as the material of the passivation layer 208 described in association with FIG. 2A.

In an embodiment, the passivation layer 550 and the via 540 are disposed on a metallization structure 530 that is coupled to a contact structure 504. In an embodiment, contact structure 504 is above and electrically coupled with a drain region 506 of an access transistor 508 disposed above a substrate 510. In an embodiment, the metallization structure 530 includes one or more embodiments of the metallization structure 204 described in association with FIG. 2A. In an embodiment, the metallization structure 530 is disposed is a via formed in a dielectric layer 503.

In an embodiment, the underlying substrate 510 represents a surface used to manufacture integrated circuits. Suitable substrate 510 includes a material such as single crystal silicon, polycrystalline silicon and silicon on insulator (SOI), as well as similar substrates formed of other semiconductor materials. The substrate 510 may also include semiconductor materials, metals, dielectrics, dopants, and other materials commonly found in semiconductor substrates.

In an embodiment, the access transistor 508 associated with substrate 510 are metal-oxide-semiconductor field-effect transistors (MOSFET or simply MOS transistors), fabricated on the substrate 510. In various implementations of the disclosure, the access transistor 508 may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors.

In an embodiment, the access transistor 508 of substrate 510 includes a gate stack formed of at least two layers, a gate dielectric layer 514 and a gate electrode layer 512. The gate dielectric layer 514 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 514 to improve its quality when a high-k material is used.

The gate electrode layer 512 of the access transistor 508 of substrate 510 is formed on the gate dielectric layer 514 and may consist of at least one P-type work function metal or N-type work function metal, depending on whether the transistor is to be a PMOS or an NMOS transistor. In some implementations, the gate electrode layer 512 may consist of a stack of two or more metal layers, where one or more metal layers are work function metal layers and at least one metal layer is a conductive fill layer.

For a PMOS transistor, metals that may be used for the gate electrode layer 512 include, but are not limited to, ruthenium, palladium, platinum, cobalt, nickel, and conductive metal oxides, e.g., ruthenium oxide. A P-type metal layer will enable the formation of a PMOS gate electrode layer 512 with a work function that is between about 4.9 eV and about 4.2 eV. For an NMOS transistor, metals that may be used for the gate electrode layer 512 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode layer 512 with a work function that is between about 3.9 eV and about 4.2 eV.

In some implementations, the gate electrode layer 512 may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode layer 512 may simply be a planar layer that is substantially parallel to the top surface of the substrate and does not include sidewall portions substantially perpendicular to the top surface of the substrate. In further implementations of the disclosure, the gate electrode layer 512 may consist of a combination of U-shaped structures and planar, non-U-shaped structures. For example, the gate electrode layer 512 may consist of one or more U-shaped metal layers formed atop one or more planar, non-U-shaped layers.

In some implementations of the disclosure, a pair of sidewall spacers 516 may be formed on opposing sides of the gate stack that bracket the gate stack. The sidewall spacers 516 may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source region 518 and drain region 506 are disposed within the substrate adjacent to the gate stack of each MOS transistor. The source region 518 and drain region 506 are generally formed using either an implantation/diffusion process or an etching/deposition process. In the former process, dopants such as boron, aluminum, antimony, phosphorous, or arsenic may be ion-implanted into the substrate to form the source region 518 and drain region 506. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source region 518 and drain region 506. In some implementations, the source region 518 and drain region 506 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 518 and drain region 506 may be formed using one or more alternate semiconductor materials such as germanium or a suitable group III-V compound. And in further embodiments, one or more layers of metal and/or metal alloys may be used to form the source region 518 and drain region 506.

In an embodiment, an RRAM contact 526 is disposed in a second dielectric layer 524 disposed above the passivation layer 550. In an embodiment, second dielectric layer includes a material that is the same or substantially the same as the dielectric layer 503. In an embodiment, a gate contact 520 and a source contact 522 are disposed in the dielectric layer 503 above the gate electrode layer 512 and source region 518, respectively. In an embodiment, a source conductive interconnect 460 is disposed in a via formed in the second dielectric layer 524 and in the passivation layer 550. The source conductive interconnect 460 is in contact with and coupled with the source contact 522. In an embodiment, a gate conductive interconnect 570 is disposed in a via formed in the second dielectric layer 524 and in the passivation layer 550. The gate conductive interconnect 570 is in contact with and coupled with the gate contact 520.

Figure 6:
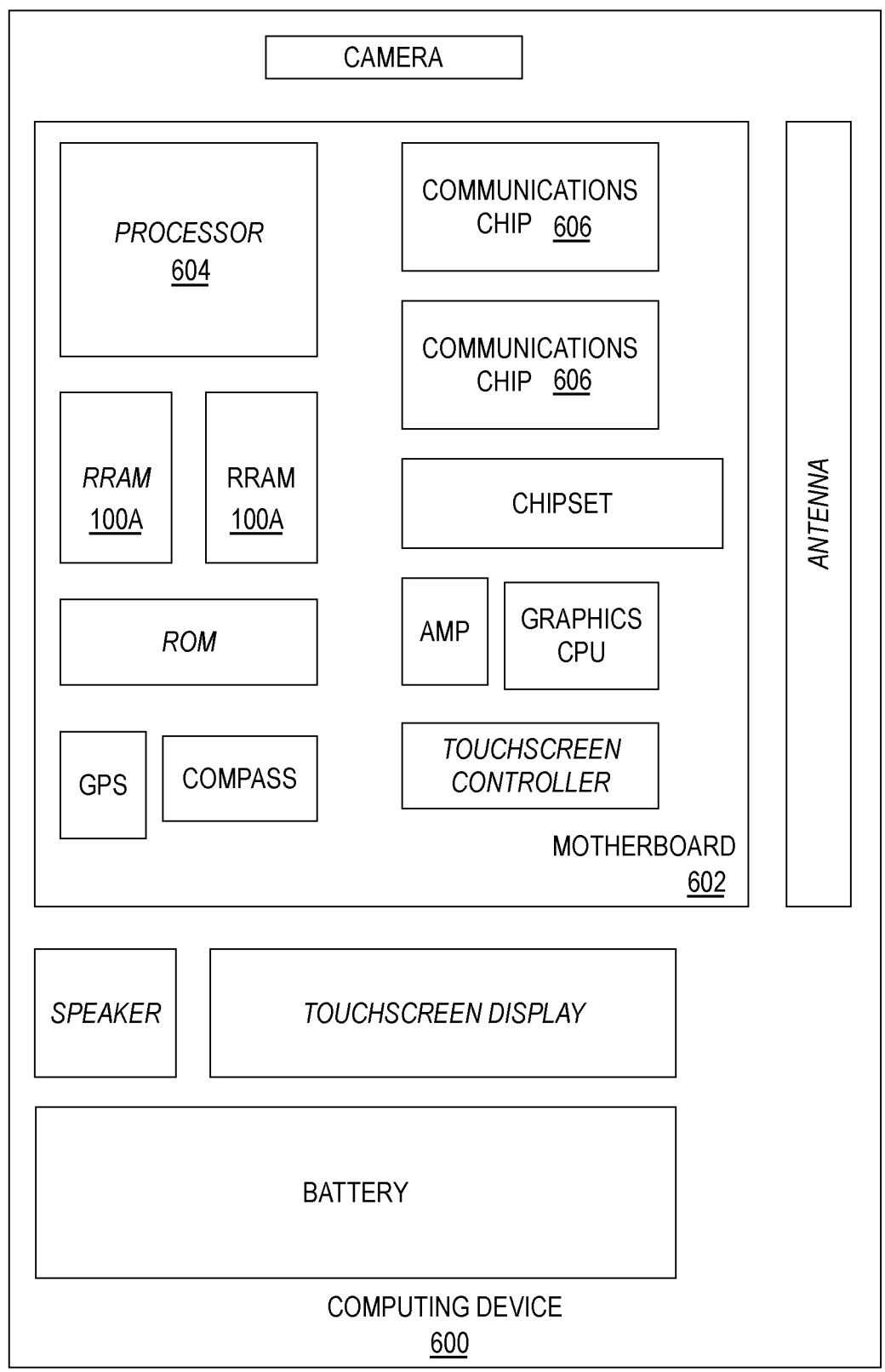
FIG. 6 illustrates a computing device in accordance with embodiments of the present invention.

FIG. 6 illustrates a computing device in accordance with embodiments of the present invention. The computing device 600 houses a motherboard 602. The motherboard 602 may include a number of components, including but not limited to a processor 604 and at least one communication chip 606. The processor 604 is physically and electrically coupled to the motherboard 602. In some implementations, the at least one communication chip 606 is also physically and electrically coupled to the motherboard 602. In further implementations, the communication chip 606 is part of the processor 604.

Depending on its applications, computing device 600 may include other components that may or may not be physically and electrically coupled to the motherboard 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.11 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of embodiments of the disclosure, the integrated circuit die of the processor includes one or more memory devices, such as an RRAM device 252 including a dual bottom electrode 326 in accordance with embodiments of the present disclosure. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of an embodiment of the disclosure, the integrated circuit die of the communication chip includes RRAM elements such as RRAM device 252 integrated with access transistors, built in accordance with embodiments of the present disclosure.

In further implementations, another component housed within the computing device 600 may contain a stand-alone integrated circuit memory die that includes one or more memory elements such as RRAM device 252, built in accordance with embodiments of the present disclosure.

In various implementations, the computing device 600 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
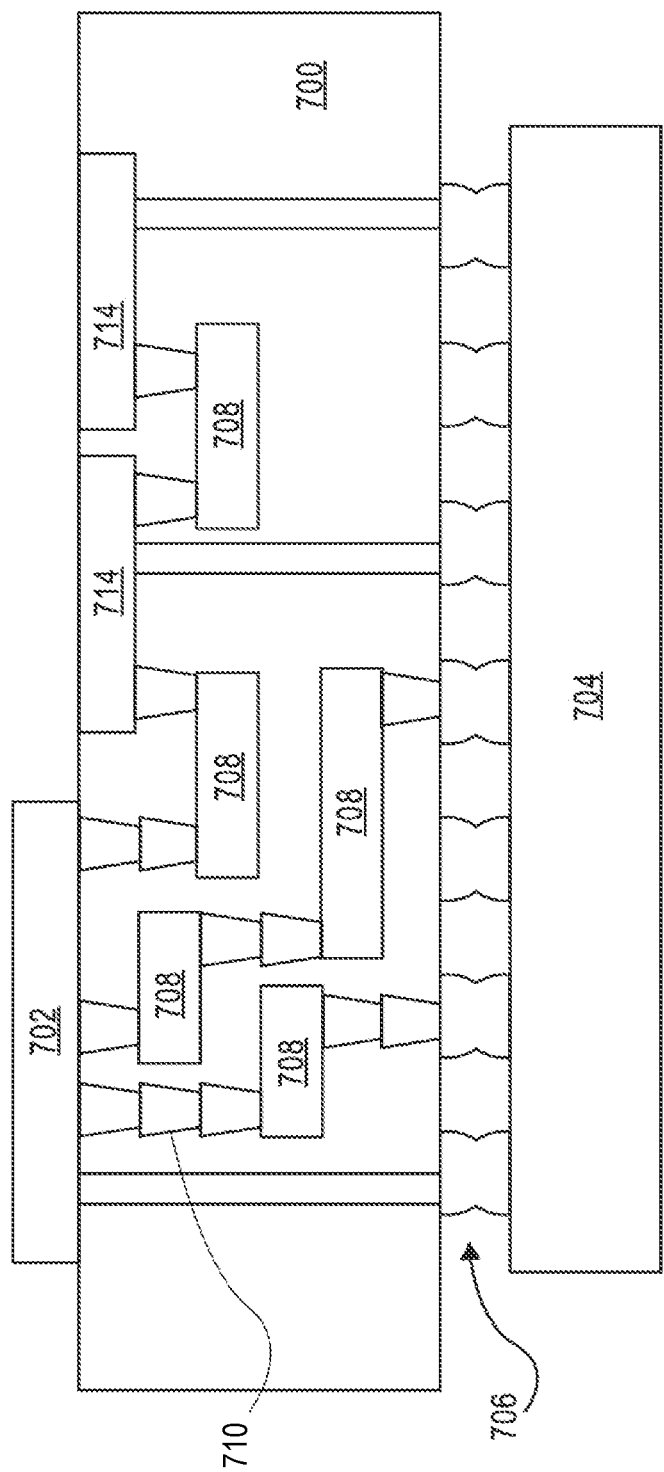
FIG. 7 illustrates an interposer that includes one or more embodiments of the invention.

FIG. 7 illustrates an interposer that includes one or more embodiments of the disclosure. The integrated circuit (IC) structure 700 is an intervening structure used to bridge a first substrate 702 to a second substrate 704. The first substrate 702 may be, for instance, an integrated circuit die. The second substrate 704 may be, for instance, a memory module, a computer mother, or another integrated circuit die. The memory module may include one or more memory devices such as an RRAM device 100B or an RRAM device 252. Generally, the purpose of an integrated circuit (IC) structure 700 is to spread a connection to a wider pitch or to reroute a connection to a different connection. For example, an integrated circuit (IC) structure 700 may couple an integrated circuit die to a ball grid array (BGA) 711 that can subsequently be coupled to the second substrate 704. In some embodiments, the first and second substrates 702/704 are attached to opposing sides of the integrated circuit (IC) structure 700. In other embodiments, the first and second substrates 702/704 are attached to the same side of the integrated circuit (IC) structure 700. And in further embodiments, three or more substrates are interconnected by way of the integrated circuit (IC) structure 700.

The integrated circuit (IC) structure 700 may be formed of an epoxy resin, a fiberglass-reinforced epoxy resin, a ceramic material, or a polymer material such as polyimide. In further implementations, the integrated circuit (IC) structure 700 may be formed of alternate rigid or flexible materials that may include the same materials described above for use in a semiconductor substrate, such as silicon, germanium, and other group III-V and group IV materials.

The integrated circuit (IC) structure 700 may include metal interconnects 708 and via 710, including but not limited to through-silicon vias (TSVs) 710. The integrated circuit (IC) structure 700 may further include embedded devices 714, including both passive and active devices. Such devices include, but are not limited to, capacitors, decoupling capacitors, resistors, inductors, fuses, diodes, transformers, transistors, one or more RRAM devices such as RRAM device 100B and/or RRAM device 252, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 700. In accordance with embodiments of the present disclosure, apparatuses or processes disclosed herein may be used in the fabrication of integrated circuit (IC) structure 700.

Thus, embodiments of the present disclosure include a multi-switching layer stack for a resistive random access memory (RRAM) device and methods of fabrication. The following examples pertain to further embodiments.

In first examples, a memory device includes a substrate, a bottom electrode above the substrate, a first switching layer on the bottom electrode, a second switching layer including aluminum on the first switching layer, an oxygen exchange layer on the second switching layer and a top electrode on the oxygen exchange layer.

In second examples, for any of first examples, the bottom electrode, the first switching layer, the second switching layer, the oxygen exchange layer and the top electrode form a stack having a sidewall, and the memory device further includes a dielectric spacer film surrounding the sidewall of the stack and extending from a lowermost portion of the bottom electrode to an uppermost portion of the top electrode.

In third examples, for any of the first through second examples, the first switching layer includes a metal and oxygen.

In fourth examples, for any of the first through third examples, the first switching layer includes hafnium oxide, tantalum oxide, zirconium oxide, titanium oxide or tungsten oxide.

In fifth examples, for any of the first through fourth examples, the first switching layer is sub-stoichiometric.

In sixth examples, for any of the first through fifth examples, the first switching layer has a thickness of at least 2 nm.

In seventh examples, for any of the first through sixth examples, the second switching layer includes aluminum and oxygen.

In eighth examples, for any of the first through seventh examples, the second switching layer has a thickness of at least 1 nm.

In ninth examples, for any of the first through eighth examples, the first switching layer has a thickness between 2 nm and 4 nm and wherein the second switching layer has a thickness between 1 nm and 2 nm and further wherein the first switching layer and the second switching layer have a total combined thickness between 3 nm-5 nm.

In tenth examples, for any of the first through ninth examples, the first switching layer and the oxygen exchange layer include a same metal.

In eleventh examples, for any of the first through tenth examples, the bottom electrode includes a titanium nitride, tantalum nitride, tungsten or ruthenium and wherein at least a portion of an interface between the bottom electrode metal layer and the first switching layer is oxidized. In twelfth examples, for any of the first through eleventh examples, the top electrode includes titanium nitride, tantalum nitride, tungsten and ruthenium.

In thirteenth examples, for any of the first through twelfth examples, the bottom electrode and the top electrode are a same material, the material including titanium nitride, tantalum nitride, tungsten and ruthenium.

In fourteenth examples, includes a 1T-1R memory cell, the 1T-1R memory cell includes a transistor above a substrate, where the transistor includes a source structure and a drain structure, a gate structure between the source structure and the drain structure, a source contact coupled to the source structure and a drain contact coupled to the drain structure, an interconnect disposed above the drain contact and coupled to the drain contact and a resistive random access memory (RRAM) device coupled to the interconnect, the RRAM device includes a substrate, a bottom electrode above the substrate, a first switching layer on the bottom electrode, a second switching layer including aluminum on the first switching layer, an oxygen exchange layer on the second switching layer and a top electrode on the oxygen exchange layer.

In fifteenth examples, for any of the fourteenth examples, first switching layer includes a metal and oxygen.

In sixteenth examples, for any of the fourteenth through fifteenth examples, the first switching layer includes hafnium oxide, tantalum oxide, zirconium oxide, titanium oxide or tungsten oxide.

In seventeenth examples, for any of the fourteenth through sixteenth examples, the first switching layer has a thickness of at least 2 nm.

In eighteenth examples, for any of the fourteenth through seventeenth examples, the second switching layer includes aluminum and oxygen.

In nineteenth examples, for any of the fourteenth through eighteenth examples, the second switching layer has a thickness of at least 1 nm.

In twentieth examples, for any of the fourteenth through nineteenth examples, the first switching layer has a thickness between 2 nm and 4 nm and where the second switching layer has a thickness between 1 nm and 2 nm and further where the first switching layer and the second switching layer have a total combined thickness between 3 nm-5 nm.

In twenty first examples, a method of fabricating a memory device includes forming an interconnect structure above a substrate. The method further includes depositing a bottom electrode layer above the interconnect structure and depositing a first switching material layer on the bottom electrode layer. The method further includes depositing a second switching material layer on the first switching material layer and depositing a top electrode layer above the second switching material layer. The method further includes forming a sidewall in the top electrode and in the oxygen exchange layer by patterning the top electrode layer and the oxygen exchange layer. The method further includes patterning the first switching material layer and the second switching material layer, where the patterning includes forming a first switching layer and a second switching layer, each having a sidewall and patterning the bottom electrode layer forming a bottom electrode having a sidewall.

In twenty second examples, for any of the twenty first examples, the method includes forming the first switching layer by depositing a metal film using a physical vapor deposition process in an ambient containing oxygen flowing at a constant or at a variable rate.

In twenty third examples, for any of the twenty first through twenty second examples, the method includes forming the second switching layer by depositing aluminum using a physical vapor deposition process in an ambient containing oxygen flowing at a constant or at a variable rate.

In twenty fourth examples, for any of the twenty first through twenty third examples, the method includes annealing after deposition of the top electrode layer.

In twenty fifth examples, for any of the twenty first through twenty fourth examples the method includes forming a dielectric spacer on the second switching layer and on the sidewall of the oxygen exchange layer and on the top electrode.

What is claimed is:

1. A memory device, comprising:
   a substrate;
   a bottom electrode above the substrate;
   a first switchable layer on the bottom electrode;
   a second switchable layer comprising aluminum on the first switchable layer;
   an oxygen exchange layer on the second switchable layer; and
   a top electrode on the oxygen exchange layer;
   wherein the bottom electrode, the first switchable layer, the second switchable layer, the oxygen exchange layer and the top electrode form a stack having a sidewall, and wherein the memory device further comprises a dielectric spacer film surrounding the sidewall of the stack and extending from a lowermost portion of the bottom electrode to an uppermost portion of the top electrode, and
   wherein the first switchable layer has a thickness between 2 nm and 4 nm, wherein the second switchable layer has a thickness between 1 nm and 2 nm, and wherein the first switchable layer and the second switchable layer have a total combined thickness between 3 nm and 5 nm.

2. The memory device of claim 1, wherein the first switchable layer comprises a metal and oxygen.

3. The memory device of claim 2, wherein the first switchable layer comprises hafnium oxide, tantalum oxide, zirconium oxide, titanium oxide, or tungsten oxide.

4. The memory device of claim 3, wherein the first switchable layer is sub-stoichiometric.

5. The memory device of claim 1, wherein the second switchable layer comprises aluminum and oxygen.

6. The memory device claim 1, wherein the first switchable layer and the oxygen exchange layer comprise a same metal.

7. A memory device, comprising:
   a substrate;
   a bottom electrode above the substrate, wherein the bottom electrode comprises one or more of titanium, tantalum, tungsten, ruthenium, and nitrogen;
   a first switchable layer on the bottom electrode, wherein at least a portion of an interface between the bottom electrode and the first switchable layer is oxidized;
   a second switchable layer comprising aluminum on the first switchable layer;
   an oxygen exchange layer on the second switchable layer;
   a top electrode on the oxygen exchange layer, wherein the second switchable layer, the oxygen exchange layer, and the top electrode form a stack having a sidewall; and
   a dielectric spacer film on the sidewall of the stack and extending at least from a lowermost portion of the second switchable layer to an uppermost portion of the top electrode,
   wherein the first switchable layer has a thickness between 2 nm and 4 nm, wherein the second switchable layer has a thickness between 1 nm and 2 nm, and wherein the first switchable layer and the second switchable layer have a total combined thickness between 3 nm and 5 nm.

8. The memory device of claim 1, wherein the top electrode comprises titanium nitride, tantalum nitride, tungsten, or ruthenium.

9. The memory device of claim 1, wherein the bottom electrode and the top electrode are a same material, the material comprising titanium nitride, tantalum nitride, tungsten, or ruthenium.

10. A 1T-1R memory cell, comprising:
a resistive random access memory (RRAM) device including
a bottom electrode comprising a metal layer;
a first switchable layer on the bottom electrode, wherein at least a portion of an interface between the bottom electrode metal layer and the first switchable layer is oxidized;
a second switchable layer comprising $Al_2O_3$ (aluminum oxide) on the first switchable layer;
an oxygen exchange layer on the second switchable layer; and
a top electrode on the oxygen exchange layer,
wherein the first switchable layer has a thickness of at least 2 nm, and wherein the second switchable layer has a thickness of at least 1 nm.

11. The 1T-1R memory cell of claim 10, wherein the first switchable layer comprises a metal and oxygen.

12. The 1T-1R memory cell of claim 10, wherein the first switchable layer comprises hafnium oxide, tantalum oxide, zirconium oxide, titanium oxide, or tungsten oxide.

13. The 1T-1R memory cell of claim 10, wherein the first switchable layer has a thickness between 2 nm and 4 nm, wherein the second switchable layer has a thickness between 1 nm and 2 nm, and wherein the first switchable layer and the second switchable layer have a total combined thickness between 3 nm and 5 nm.

14. The memory device of claim 7, wherein the stack further includes the bottom electrode and the first switchable layer, and wherein the dielectric spacer film extends from a lowermost portion of the bottom electrode to the uppermost portion of the top electrode.

15. The memory device of claim 7, wherein the first switchable layer comprises a metal and oxygen, and wherein the second switchable layer comprises aluminum and oxygen.

16. The memory device of claim 7, wherein the first switchable layer and the oxygen exchange layer comprise a same metal.

17. The memory device of claim 7, wherein one or both of the bottom electrode and the top electrode comprises titanium, tantalum, tungsten, or ruthenium.

18. The 1T-1R memory cell of claim 10, wherein the second switchable layer comprises graded concentration of oxygen, with a first concentration of oxygen within the second switchable layer near the first switchable layer, and a second concentration of oxygen within the second switchable layer near the oxygen exchange layer, wherein the first concentration is different from the second concentration.

19. The 1T-1R memory cell of claim 18, wherein the first concentration is higher than the second concentration.

20. The 1T-1R memory cell of claim 10, comprising a dielectric spacer film on a sidewall of the second switchable layer, on a sidewall of the oxygen exchange layer, and on a sidewall of the top electrode.

* * * * *